US008323408B2

(12) United States Patent
Zolla et al.

(10) Patent No.: US 8,323,408 B2
(45) Date of Patent: Dec. 4, 2012

(54) METHODS AND APPARATUS TO PROVIDE GROUP VIA MATERIALS TO REACTORS FOR GROUP IBIIIAVIA FILM FORMATION

(75) Inventors: Howard G. Zolla, San Jose, CA (US); Douglas W. Young, Sunnyvale, CA (US); Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 956 days.

(21) Appl. No.: 12/137,510

(22) Filed: Jun. 11, 2008

(65) Prior Publication Data

US 2009/0148598 A1    Jun. 11, 2009

Related U.S. Application Data

(63) Continuation-in-part of application No. 11/953,822, filed on Dec. 10, 2007.

(51) Int. Cl.
    *C23C 16/00*    (2006.01)
(52) U.S. Cl. .................. 118/718; 118/724; 118/726
(58) Field of Classification Search .......... 118/718, 118/726
    See application file for complete search history.

(56) References Cited

U.S. PATENT DOCUMENTS

| 2,508,500 | A | * | 5/1950 | De Lange et al. | 118/718 |
|---|---|---|---|---|---|
| 2,664,852 | A | * | 1/1954 | Chadsey, Jr. | 118/718 |
| 2,910,039 | A | * | 10/1959 | Patton et al. | 118/719 |
| 3,183,563 | A | * | 5/1965 | Smith, Jr. | 164/506 |
| 3,231,337 | A | * | 1/1966 | Barkemeyer et al. | 118/724 |
| 4,112,137 | A | * | 9/1978 | Zega | 427/529 |
| 4,265,859 | A | | 5/1981 | Jewett | |
| 4,542,711 | A | | 9/1985 | Izu et al. | |
| 4,563,976 | A | | 1/1986 | Foell et al. | |
| 5,000,114 | A | * | 3/1991 | Yanagi et al. | 118/733 |
| 5,015,503 | A | | 5/1991 | Varrin et al. | |
| 5,169,451 | A | * | 12/1992 | Yanagi et al. | 118/718 |
| 5,578,503 | A | | 11/1996 | Karg et al. | |
| 5,772,431 | A | | 6/1998 | Ikeya et al. | |
| 5,935,324 | A | | 8/1999 | Nakagawa et al. | |
| 6,036,822 | A | | 3/2000 | Ikeya et al. | |
| 6,190,937 | B1 | | 2/2001 | Nakagawa et al. | |
| 6,207,219 | B1 | | 3/2001 | Ikeya et al. | |

(Continued)

FOREIGN PATENT DOCUMENTS

DE    10006778    8/2001

(Continued)

OTHER PUBLICATIONS

International Search Report issued Jul. 31, 2009 in corresponding PCT/US2009/46072.

(Continued)

*Primary Examiner* — Karla Moore
(74) *Attorney, Agent, or Firm* — Pillsbury Winthrop Shaw Pittman LLP

(57) ABSTRACT

Processes and apparatus are described that form a solar cell absorber on a surface of a workpiece by reacting a precursor layer disposed on the surface of the workpiece with an absorber constituent vapor in a heating chamber. The absorber constituent material is delivered from an absorber constituent material delivery system in molten form into a container in the heating chamber and vaporized to be used during the reaction.

8 Claims, 3 Drawing Sheets

U.S. PATENT DOCUMENTS

| | | | |
|---|---|---|---|
| 6,217,649 B1 | 4/2001 | Wallace et al. | |
| 6,281,098 B1 | 8/2001 | Wang et al. | |
| 7,156,960 B2 * | 1/2007 | Vanden Brande et al. | 204/192.12 |
| 7,194,197 B1 | 3/2007 | Wendt et al. | |
| 2005/0092236 A1 | 5/2005 | Bender | |
| 2005/0244580 A1 * | 11/2005 | Cok et al. | 427/248.1 |
| 2006/0096537 A1 | 5/2006 | Tuttle | |
| 2007/0111367 A1 | 5/2007 | Basol | |
| 2007/0169695 A1 | 7/2007 | Schneiders et al. | |
| 2008/0023070 A1 | 1/2008 | Sinha | |
| 2008/0095938 A1 * | 4/2008 | Basol | 427/255.26 |
| 2008/0175993 A1 | 7/2008 | Ashjaee et al. | |

FOREIGN PATENT DOCUMENTS

| | | |
|---|---|---|
| EP | 0 318 315 | 5/1989 |
| JP | 2002217213 | 8/2002 |
| JP | 2003273135 | 9/2003 |
| JP | 2003282600 | 10/2003 |
| WO | WO 01/37324 | 5/2001 |
| WO | WO 2006/047207 | 5/2006 |
| WO | WO 2007/047888 | 4/2007 |
| WO | WO 2008/085604 | 7/2008 |

OTHER PUBLICATIONS

International Search Report issued Sep. 2, 2009 in corresponding PCT/US08/085918.

* cited by examiner

METHODS AND APPARATUS TO PROVIDE GROUP VIA MATERIALS TO REACTORS FOR GROUP IBIIIAVIA FILM FORMATION

CROSS REFERENCE TO RELATED APPLICATIONS

This application is a continuation-in-part of U.S. application Ser. No. 11/953,822 filed on Dec. 10, 2007, which application is expressly incorporated by reference herein.

BACKGROUND OF THE INVENTION

1. Field of the Invention

The present invention relates to method and apparatus for preparing thin films of semiconductor films for radiation detector and photovoltaic applications.

2. Description of the Related Art

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since the early 1970's there has been an effort to reduce the cost of solar cells for terrestrial use. One way of reducing the cost of solar cells is to develop low-cost thin film growth techniques that can deposit solar-cell quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications. Alkali metals of Group IA, such as K, Na and Li are often included in the CIGS(S) absorbers as dopants to improve their photovoltaic properties.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of $Cu(In,Ga,Al)(S,Se,Te)_2$, is grown over a conductive layer 13 or contact layer, which is previously deposited on the substrate 11 and which acts as the electrical contact to the device. The substrate 11 and the conductive layer 13 form a base 20. Various conductive layers including Mo, Ta, W, and Ti have been used in the solar cell structure of FIG. 1. If the substrate itself is a properly selected conductive material such as Ta foil, Mo foil etc., it is possible not to use a conductive layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

In a thin film solar cell employing a Group IBIIIAVIA compound absorber, the cell efficiency is a strong function of the molar ratio of IB/IIIA. If there are more than one Group IIIA materials in the composition, the relative amounts or molar ratios of these IIIA elements also affect the properties. For a $Cu(In,Ga)(S,Se)_2$ absorber layer, for example, the efficiency of the device is a function of the molar ratio of Cu/(In+Ga). Furthermore, some of the important parameters of the cell, such as its open circuit voltage, short circuit current and fill factor vary with the molar ratio of the IIIA elements, i.e. the Ga/(Ga+In) molar ratio. In general, for good device performance Cu/(In+Ga) molar ratio is kept at around or below 1.0. As the Ga/(Ga+In) molar ratio increases, on the other hand, the optical bandgap of the absorber layer increases and therefore the open circuit voltage of the solar cell increases while the short circuit current typically may decrease. It is important for a thin film deposition process to have the capability of controlling both the molar ratio of IB/IIIA, and the molar ratios of the Group IIIA constituents in the composition. It should be noted that although the chemical formula is often written as $Cu(In,Ga)(S,Se)_2$, a more accurate formula for the compound is $Cu(In,Ga)(S,Se)_k$, where k is typically close to 2 but may not be exactly 2. However, for simplicity, the value of k will be referred to here as equal to 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compoLuInds with Ga/(Ga+In) molar ratio varying from 0 to 1, and Se/(Se+S) molar ratio varying from 0 to 1.

One technique for growing $Cu(In,Ga)(S,Se)_2$ type compound thin films for solar cell applications is a two-stage process where metallic components or constituents of the $Cu(In,Ga)(S,Se)_2$ material, i.e. Cu, In and Ga, are first deposited onto a substrate, and then reacted with the non-metallic constituents (or semi-metallic constituents), i.e. S and/or Se, in a high temperature annealing process. For example, for $CuInSe_2$ growth, thin layers of Cu and In are first deposited on a substrate and then this stacked precursor layer is reacted with Se (selenization) at elevated temperature. If the reaction atmosphere also contains sulfur (sulfidation or sulfurization), then a $CuIn(S,Se)_2$ layer can be grown. Alternatively, a CuIn$(S,Se)_2$ layer may be obtained by first selenization and then sulfidation of a metallic precursor including Cu and In. Addition of Ga in the precursor layer, i.e. use of a Cu/In/Ga stacked film precursor, allows the growth of a $Cu(In,Ga)(S,Se)_2$, or CIGSS absorber.

The two-stage process approach may also employ precursor layers including Group VIA materials. For example, a Cu(In,Ga)Se$_2$ film may be obtained by depositing In—Ga—Se and Cu—Se layers in an In—Ga—Se/Cu—Se stack and reacting them in presence of Se. Here In—Ga—Se represents reacted precursors of indium gallium selenide and Cu—Se represents copper selenide. Similarly, stacks having Group VIA materials and metallic constituents or components may also be used. Stacks learning Group VIA materials and metallic constituents include, but are not limited to In—Ga—Se/Cu/Se stack, Cu/In/Ga/Se stack, Cu/Se/In/Ga/Se stack, etc., where Se may be placed at various positions in the stack.

Selenization and/or sulfidation of precursor layers including metallic components may be carried out in various forms of Group VIA material(s). One approach involves using Group VIA material containing gases such as H$_2$Se, H$_2$S, Se and/or S containing organometallics or their mixtures to react, either simultaneously or consecutively, with the precursors including Cu, In and/or Ga. This way a Cu(In,Ga)(S,Se)$_2$ film may be formed after annealing and reacting at elevated temperatures, which are typically in the 400-600 C range. It is possible to increase the reaction rate or reactivity by striking plasma in the reactive gas during the process of compound formation. Selenium vapors or S vapors from heated elemental sources of Se and S may also be used for selenization and sulfidation in batch furnaces such as batch tube furnaces. In this case pre-measured amounts of Se and/or S may be loaded into and then heated in a container placed in a heating zone of the batch tube furnace and their vapors may be carried by a carrier gas such as an inert gas from the heating zone to a reaction zone of the batch tube furnace where the precursor layer is placed. This way, the precursor layer is converted into a Group IBIIIAVIA compound film. Alternately, as described before, Se and/or S may be deposited over a metallic layer having Cu, In and/or Ga to form a precursor layer and then the stacked structure or precursor can be annealed at elevated temperatures to initiate reaction between the metallic elements or components and the Group VIA material(s) to form the Cu(In,Ga)(S,Se)$_2$ compound.

As indicated above, the reaction step in a two-stage process is typically carried out in batch furnaces. In this approach, a number of pre-cut substrates with precursor layers deposited on them are placed into a reaction chamber of a batch furnace. The furnace door is closed and sealed. Then the reaction chamber is pumped and purged with necessary gases and reaction is carried out for a period that may range from 5 minutes to several hours, either under flowing gas flow or under static conditions. After loading the substrates and establishing the reaction environment, such as the gaseous environment, within the reactor, the temperature of the batch furnace is typically raised to the reaction temperature, which may be in the range of 400-600° C. The ramp rate for this temperature rise is normally lower than 5° C./sec, typically less than 1° C./sec. One prior art method described in U.S. Pat. No. 5,578,503 utilizes a rapid thermal processing or annealing (RTP) approach to react the precursor layers in a batch manner, one substrate at a time. In this design the temperature of the substrate with the precursor layer is raised to the reaction temperature at a high rate, typically at around 10° C./sec.

Selenium vapor may be provided to the surface of growing Cu(In,Ga)Se$_2$ layer by various means. U.S. Pat. Nos. 5,772,431, 6,036,822, and 6,207,219 awarded to Ikeya et al. disclose examples of such delivery methods for a batch reactor design. U.S. Pat. No. 5,935,324 awarded to Nakagawa et al. describes a two-compartment design for a batch reactor, where one compartment is for Se supply and the second compartment is for reaction and formation of the Group IBIIIAVIA compound film.

Design of the reaction chamber to carry out selenization/sulfidation processes is critical for the quality of the resulting compound film, the efficiency of the solar cells, throughput, material utilization and cost of the process. Therefore, there is need for new processes and tool designs to carry out the reaction of precursor layers to form high quality, low cost CIGS type absorber layers for solar cells in a large scale manufacturing environment in a continuous or roll-to-roll manner.

SUMMARY

The present invention provides methods and apparatus that form a solar cell absorber on a surface of a workpiece by reacting a precursor layer disposed on the surface of the workpiece with an absorber constituent vapor in a heating chamber. The absorber constituent material is delivered from an absorber constituent material delivery system into a container in molten form, which container is disposed in the reaction area of a heating chamber and vaporized to be used during the reaction.

In one aspect, a roll-to-to-roll apparatus, and method associated therewith, are used used for increased throughput.

In another aspect, a batch processing system, and method associated therewith, are described.

Other aspects and advantages of the invention are disclosed, including for example, obtaining using a feeder system that emits the constituent material in either solid or molten form.

DESCRIPTION OF THE INVENTION

Figure 1:
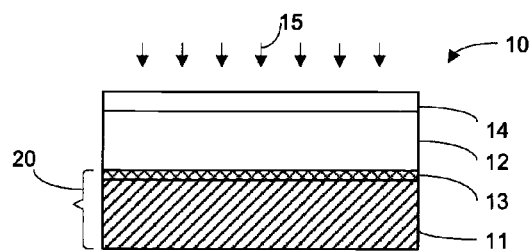
FIG. 1 is a schematic illustration of an exemplary solar cell structure of the prior art.

Present invention provides methods, structures and apparatus to carry out reaction of precursor layers for Group IBIIIAVIA compound layer growth and more specifically CIGS(S) type absorber layer formation, in an in-line manner, preferably in a roll-to-roll manner. In-line processing where the substrates carrying the precursor layers move continuously through a reactor is attractive for large scale manufacturing thin film solar cell absorbers. Roll-to-roll or reel-to-reel processing technology increases throughput and minimizes substrate handling. Furthermore, this technology allows high rate heating of substrates (RTP mode) without wasting energy. Unlike standard RTP chambers that function by rapid heating and cooling certain heating elements (such as a bank of lamps or IR heaters) which, in turn, heats a substrate placed in their proximity, the roll-to-roll RTP system of this invention has an elongated channel that is preheated to a temperature profile. Fast heating and cooling of any area on a substrate is achieved by moving the substrate through the channel and thus through the pre-determined temperature profile. Therefore, energy is conserved by not continuously heating and cooling the heating elements, which are traditionally high power lamps or heaters. Therefore, the roll-to-roll RTP system and method of the present invention is a preferred method for large scale manufacturing.

$Cu(In,Ga)(Se,S)_2$ compound has Cu, In, Ga, Se and S as its elemental components or constituent elements. Out of these elements Cu, In and Ga are metallic constituents and exhibit low vapor pressures. Vapor pressure of these metallic constituents is less than about $10^{-10}$ Torr in the temperature range of 500-600° C. Non-metallic or semi-metallic constituent elements, Se and S, on the other hand have high vapor pressures which, in the temperature range of 500-600° C., are higher than about 10 Torr. Therefore, it is challenging to keep a Group VIA material vapor pressure over the precursor layer during a reaction carried out to form the compound, especially in un-sealed reactors.

In a two-stage process that involves forming a metallic precursor comprising Cu, In and Ga on a base, optionally depositing a Group VIA material such as Se layer over the metallic precursor forming a precursor layer or structure, and subjecting the structure to a temperature of 400-600° C. in a batch RTP furnace with a temperature rise rate of around 10° C./sec, some of the Se at the top of the structure may vaporize before having a chance to fully react with Cu, In and Ga within the structure. It is for this reason that batch RTP reactors used for CIGS formation typically have small and scaled volumes and an excess amount of Se (such as an amount that is 20-50% more than what is needed to form the compound) is deposited over the metallic precursor. Alternately, Se vapors may be delivered to the location where the reaction of the precursor structure is carried out. This way it is assured that there is excess Se overpressure in the RTP reactor which provides a sealed, small volume reaction environment to the precursor. Reactions carried out under Se-poor conditions would not result in high quality CIGS compound. Such Se deficiency would result in formation of undesirable binary phases of Cu—Se and/or In—Se and/or intermetallic compounds of Cu, In and Ga, such as $Cu_{11}(In,Ga)_9$, which would lower the photovoltaic quality of the absorber.

In a roll-to-roll RTP reactor, the reaction of a precursor layer deposited on a flexible foil base may be carried out in a continuous manner as the base comprising the precursor layer is continuously moved at a predetermined speed from a supply roll, through a heated channel (which is the RTP reactor) and to a receiving roll. The precursor layer in this case may comprise Cu, In and/or Ga, and/or Se and/or S. Examples of roll-to-roll RTP reactors are described in U.S. patent application Ser. No. 11/549,590 filed on Oct. 13, 2006 entitled "Method and Apparatus for Converting Precursor Layers into Photovoltaic Absorbers" and U.S. patent application Ser. No. 11/938,679 filed on Nov. 12, 2007 entitled "Reel-to-Reel Reaction of Precursor Film to Form Solar Cell Absorber, which are incorporated by reference herein. Since the flexible foil or the web has to enter and exit the heated channel through openings, this type of roll-to-roll reactor is not completely sealed as is the case for batch, small-volume conventional RTP reactors. Therefore, building an overpressure of a Group VIA material and/or varying the amount of this overpressure within such a roll-to-roll RTP reactor is challenging.

There may be various ways to address the issue of providing adequate amount of Group VIA material to the precursor layer during a RTP reaction. One exemplary process may be performed using a structure having "substrate/contact layer/metallic precursor/Se" stack in a roll to roll reactor of the present invention. The metallic precursor of this example may comprise Cu, In and Ga and the goal of the reaction step may be to form a "base/CIGS" or "substrate/contact layer/CIGS" configuration after the reaction step. One way of addressing the issue of Se loss from the roll-to-roll RTP reactor during the reaction is increasing the thickness of the Se layer over the metallic precursor. For example, 50-200% more Se may be deposited over the metallic precursor instead of the 20-50% excess, which is more common. Increasing the Se layer thickness, however, may cause problems such as poor morphology and adhesion problems in the CIGS layer formed as a result of the RTP reaction step. For example, to form a nominally 1-1.5 micrometers thick CIGS absorber a 0.8-1.5 micrometers thick Se film may normally be deposited over a metallic precursor comprising Cu, In and Ga and then the structure or precursor layer formed may be annealed in a RTP tool to form the CIGS compound. If the Se layer thickness is tripled to increase the Se overpressure in the reactor, the 2.4-4.5 micrometers thick Se film may melt when the temperature of the structure exceeds about 230° C. during reaction and such thick melt may form a liquid Se phase with non-uniform thickness over the metallic precursor due to poor wetting of the metallic precursor surface by the Se melt. Such non-uniform molten Se over the precursor surface interferes with the formation of high quality CIGS grains uniformly throughout the reacting structure. Therefore, it is more desirable to provide the excess Se to the surface of the reacting precursor layer in a gaseous form rather than in the form of a melt.

The present invention provides a method and apparatus such as a roll-to-roll rapid thermal processing (RTP) apparatus or chamber employing a Group VIA material delivery system, which delivers at least one molten Group VIA material to a container placed in a reaction channel of the RTP chamber. Under the heat of the reaction channel the Group VIA material vaporizes and the vapor thus formed is provided to the surface of a continuous flexible workpiece within the reaction channel, the surface comprising a precursor containing a Group IB material and at least one Group IIIA material. The precursor may additionally comprise a Group VIA material. This way, after the reaction, the precursor is converted to a Group IBIIIAVIA compound.

Figure 2:
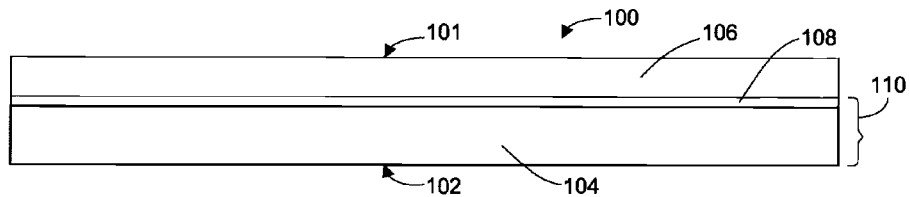
FIG. 2 is a schematic illustration of a continuous flexible workpiece having a precursor layer.

FIG. 2 exemplifies a continuous flexible workpiece 100 having a top surface 101 and a bottom surface 102, which will be referred to as workpiece in the following embodiments. The workpiece 100 may, for example, be 10 to 2000 meters in length and 0.1 to 2 meters in width. The bottom surface 102 of the workpiece 100 may also be the back surface of a substrate 104, while the top surface 101 is the front surface of a precursor layer 106 or stack. A contact layer 108 may be placed between the substrate 104 and the precursor layer 106. The contact layer 108 and the substrate 104 will be referred to as a base 110 of the workpiece 100. The substrate 104 may be a conductive material such as a metal or alloy, for example, flexible steel or aluminum alloy web, or a nonconductive material, for example, a polymer web. In the following embodiments, the substrate 104 is preferably a steel web having a thickness of about 25-125 micrometers, preferably 25-50 micrometers. The contact layer 108 may comprise conductors such as Mo, W, Ru, Os and Irii and may be 200-1000 nm thick, preferably 300-500 nm thick. Dimensions of the various layers in the figures are exemplary and are not drawn to scale.

The precursor layer 106 may be formed by depositing absorber constituents belonging to Group IB and Group IIIA of the periodic table, such as copper (Cu), gallium (Ga) and Indium (In), on the contact layer 108 of the workpiece 100 using any deposition method such as electroplating, sputtering, nano particle coating and the like. The precursor layer 106 may also comprise at least one Group VIA material such as Se, S and Te. The precursor layer 106 or stack may have a thickness in the range of 400-1000 nm, preferably, 500-800 nm. To form an absorber layer, the precursor layer 106 must be reacted in presence of excess Group VIA constituents such as Se, Te and S. It may also be beneficial to introduce Group IA dopant materials (Na, Li and K) into the forming compound.

Figure 3:
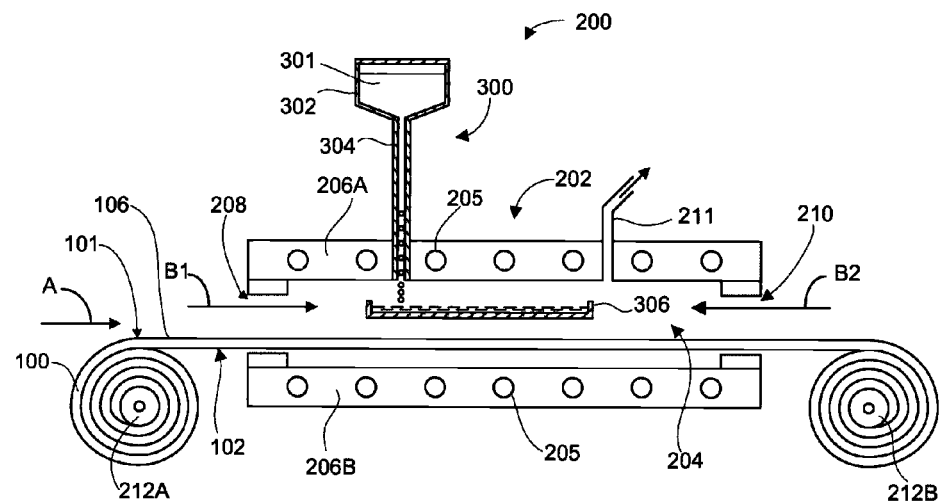
FIG. 3 is a schematic illustration of an embodiment of a roll to roll system of the present invention including a heating chamber and an Group VIA material delivery system which is integrated to the heating chamber.

FIG. 3 shows an embodiment of a roll to roll processing system 200 of the present invention employing a heating chamber 202 and an absorber constituent delivery system 300. The heating chamber 202 comprises a reaction channel 204 defined by a top wall 206A and a bottom wall 206B, and side walls (not shown) of the heating chamber 202. The top wall 206A, and the bottom wall 206B, and optionally the side walls include heating elements 205 to heat the reaction channel 204. The reaction channel 204 extends between an entrance opening 208 and exit opening 210 of the heating chamber 202. The entrance opening 208 and exit opening 210 are preferably narrower than the rest of the reaction channel 204 between the two. The workpiece 100 of the present invention extends through the reaction channel 204, and between a supply roll 212A and a receiving roll 212B. During the process, portions of the workpiece 100 are unwrapped from the supply roll 212A, advanced through the reaction channel 204 in the direction of arrow A, and taken up and wrapped around the receiving roll 212B. As is described above in FIG. 2, the front surface 101 of the workpiece 100 comprises the precursor layer 106, and thereby the surface 101 is the surface of the precursor layer 106 as well.

The absorber constituent delivery system 300 of the present invention delivers an absorber constituent 301, such as a Group VIA material, to the precursor layer 106, as the workpiece 100 is advanced through the reaction channel 204. Accordingly, the delivery system 300 comprises an absorber constituent feeder 302 (feeder), a supply tube 304, and an absorber constituent container 306 (container). The feeder 302 includes a mechanical feeding device (not shown) such as a vibrator, an auger and the like, that pushes the absorber constituent 301 towards the supply tube 304. As shown in FIG. 3, the container 306 is placed in the reaction channel 204, between the entrance opening 208 and the exit opening 210, and between the workpiece 100 and the top wall 206A of the heating chamber 202. As will be described in detail below, the feeder 302 is placed outside the heating chamber 202 and connected to the heating chamber 202 in a sealed manner through the supply tube 304. The supply tube 304 connects the feeder 302 to the reaction chamber 204 through the top wall 206A of the heating chamber 202. During the process, the Group VIA material 301, such as Se, is supplied into the feeder 302, preferably, in solid powder form or in small solid particle form so that the Group VIA material 301 flow through the supply tube 304 towards the heating chamber 202 can be controlled by controlling the amount of solid particles delivered to the supply tube 304. As the flow of the Group VIA material 301 approaches the heating chamber 202 and passes through the top wall 206A, the heat from the heated walls and the reaction channel 204 causes the Group VIA material 301 to melt and flow into the container 306 in liquid form. The liquid or molten Group VIA material in the container 306 vaporizes due to the heat inside the reaction channel 204 and reacts with the ingredients of the precursor layer 106 to form the Group IBIIIAVIA compound film or absorber film on the base 110 (see FIG. 2) as the workpiece 100 is advanced through the reaction channel 204.

During the process an inert gas, depicted as arrow B1, may preferably be flown in the direction of the advancing workpiece 100 so as to move the Group VIA material vapor along with the workpiece 100 and towards at least one exhaust 211. An inert gas depicted as arrow B2 may also be flown through the exit opening 210 into the reaction channel 204. This way the Group VIA material vapor is trapped in the reaction channel 204 and can be more efficiently used in the reaction with the precursor layer 106, and then can be exhausted through the exhaust 211. The narrow entrance and exit openings 208 and 210, as well as the inert gas flows B1 and B2 present high resistance to Group VIA material vapor escape through the inlet and exit openings to the outside of the reaction channel 204. This way the Group VIA material is contained in the reaction channel 204, used more efficiently for the reaction, and is not allowed to condense on the cold unreacted portions of the front surface 101 of the precursor layer 106 just outside of the entrance opening 208 and on the already reacted and cooled down portions of the workpiece 100 as they move through the exit opening 210 to outside of the reaction channel 204. It should be appreciated that a CIGS absorber layer containing a solid film of a Group VIA material condensed on its top surface would not be usable for solar cell fabrication unless this Group VIA film would be removed from the surface through an additional process step. A more detailed description of various designs of heating chambers or reactors may be found in U.S. patent application Ser. No. 12/027,169 entitled 'Reel-to-Reel Reaction of Precursor Film to Form Solar Cell Absorber' filed on Feb. 6, 2008 which is incorporated herein by reference in its entirety, and assigned to the assignee of the present invention.

An exemplary inert gas flown into the reaction channel 204 through the entrance and exit openings 208 and 210 may be nitrogen ($N_2$) gas or forming gas, such as an inert gas comprising a small percentage (for example 2-4%) hydrogen. Other gases such as CO may also be used to reduce oxidation of the reacting film because CO, just like hydrogen is an oxide reducing gas. Further during the process, the heating elements 205 are preferably kept at a temperature above the melting temperature of the Group VIA material, which is about 220° C. for Se. The more preferred temperature of the reaction channel 204 where the Group VIA material is delivered to is in the range of 300-600° C., most preferably in the range of 350-600° C. If Te is employed as a Group VIA material, the temperature of the channel may be at least 450° C. to be able to keep the Te in molten form. Although in a preferred embodiment the container 306 is heated by the heat of the reaction channel 204, itself, it is also possible to have extra heating means (not shown) such as an additional heater, to heat the container 306. In this case the container may be raised to a higher temperature than the reaction channel 204 at a given location within the channel.

Figure 4:
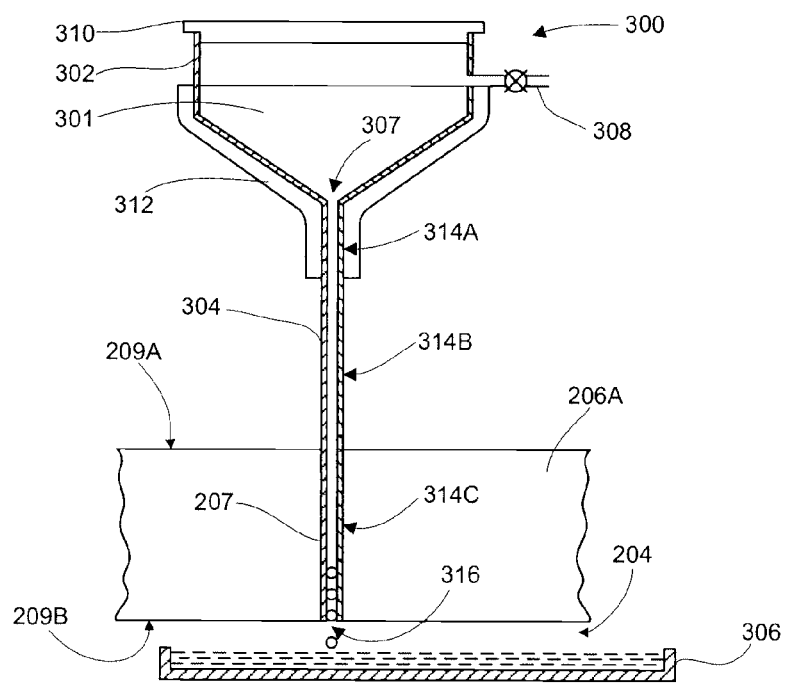
FIG. 4 is a schematic detailed illustration of the Group VIA material delivery system shown in FIG. 3, wherein the Group VIA material delivery system includes a feeder with a cooling apparatus, a supply tube and a container.

FIG. 4 shows in detailed view, the components of the exemplary absorber constituent delivery system 300 of the present invention. The system components, i.e., the feeder 302, the supply tube 304 and the container 306 may be made of a metallic material such as stainless steel. The container 306 may be more preferably made of a ceramic material like alumina or it may be constructed of quartz or graphite among many other suitable materials that do not react appreciably with molten Group VIA materials. The container 306 may be shaped as a tray with a bottom wall, side walls, and an entirely or partially open top to allow Group VIA material vapors to leave the container 306. Of course other shapes of the container 306 are also possible as long as they have the ability to provide the Group VIA material vapor to the reaction channel 204.

The method and apparatus of the present invention delivers molten ingredient(s) to a container 306 placed in the reaction channel 204, instead of delivering vapor or gaseous ingredients, such as Se and/or S and/or Te vapors. If, for example, Se vapors were delivered to the reaction channel 204, the amount of Se vapor delivered would have to be regulated at the Se-vapor producing source. The Se vapor would be delivered to the reaction channel 204 by a carrier gas such as nitrogen or through a heat pump (i.e. a source heated to a higher temperature, for example to 500-800° C., than the reaction channel 204 which may be kept at a temperature of 400-600° C.). To increase the Se vapor delivery one would have to increase the carrier gas flow into the reaction channel 204 or increase the temperature of the source. Increasing the carrier gas flow would affect other reaction parameters, and increasing the source temperature would be very difficult since Group VIA materials react aggressively with other elements at temperatures exceeding 500° C.

Reaction channels preferably have temperature profiles that the workpiece travels through. Selenium vapor requirement for reaction of a precursor layer (such as a precursor layer comprising Cu, In and Ga) with Se is different at different temperatures. Usually, such reaction requires less Se at low temperature (e.g. 350-400° C.) and more Se at higher temperature (e.g. 500-600° C.). This would mean that regulated amounts of Se vapor may be needed to be delivered at different places along the reaction channel with a temperature profile. This is difficult and expensive to achieve. One important benefit of the present invention is the fact that it is self regulating. The present design delivers molten ingredient(s), such as molten Se, to a container placed in the reaction channel 204. The temperature of the reaction channel 204 determines the reaction rate of the precursor layer with the Group VIA material on the workpiece and at the same time it determines the vaporization rate of the molten ingredient in the container 306. The container 306 may extend through only part of the reaction channel 204 or it may extend through substantially the whole length of the reaction channel 204. If the container 306 extends along the length of the reaction channel 204 and if there is a temperature gradient along the channel, the molten Group VIA material experiences the same temperature gradient as the workpiece. Therefore, at lower temperature regions where less Group VIA material vapor is needed, less vapor is generated. Similarly in the hotter regions of the reaction channel 204 where there is a need for higher amount of Group VIA material vapor, more vapor is generated from the section of the container in that hotter region.

The feeder 302 of the system 300 may have a cylindrically shaped side wall with a conical bottom wall having a supply opening 307. A gas inlet 308 connects an inert gas source, such as a $N_2$ gas source, to the feeder 302. The feeder has a sealable supply door 310 through which the Group VIA material 301 is supplied when replenishment is needed. The feeder 302 may be equipped with a cooling apparatus 312, for example a waterjacket, to maintain the temperature of the Group VIA material 301 below its melting point. The cooling apparatus 312 may cool the feeder walls and partially an upper section 314A of the supply tube 304. The supply tube 304 connects the supply opening 307 of the feeder 302 to the reaction channel 204. The supply tube may be made of stainless steel, preferably grade 316 type stainless steel which is highly resistant to corrosion caused by molten or near melting temperature Group VIA materials and their vapors.

Although it is possible to establish this connection in many ways, in the preferred embodiment, a lower section 314C of the supply tube 304 is sealably fitted into a hole 207 that vertically extends through the top wall 206A of the heating chamber 200, i.e., between an outer surface 209A and an inner surface 209B of the top wall 206A (see FIGS. 3 and 4). A lower opening 316 of the supply tube may be flush with the inner surface 209B of the top wall or may extend downwardly from the inner surface 209B. Since the lower section 314C is in the top wall 206A and exposed to the reaction channel 204, during the process its temperature approaches to the temperature of the reaction channel. The container 306 is positioned under the lower opening 316, by attaching it to the top wall 206A or the side walls using methods that are well known, to collect the liquid Group VIA material dripping through the lower opening 316. In this configuration, a middle section 314B of the supply tube 304 is located between the cooled upper section 314A and the heated lower section 314C of the supply tube. During the process, as the Group VIA material particles move down the middle section 314B, and as they approach to the lower section 314C, the particles begin to melt. Further, within the lower section 314C of the supply tube 304, the particles fully melt and transform into liquid and drip into the container 306 to be vaporized in time. In order to prevent Group VIA vapors from traveling upwards through the supply tube 304 and become condensed within the feeder 302, and possibly plug up the supply tube 304, a small amount of inert gas is flowed into the feeder 302 from the gas inlet 308 throughout the process. This inert gas flow (which may be in range of 1-100 standard cubic cm/minute) in the opposite direction pushes the process vapors back into the reaction chamber. Such gas flow may help the liquid Group VIA material to move down into the container 306 and at the same time may prevent vapors to move up through the supply tube 304 and condense on the cooled parts of the system 300.

Figure 5:
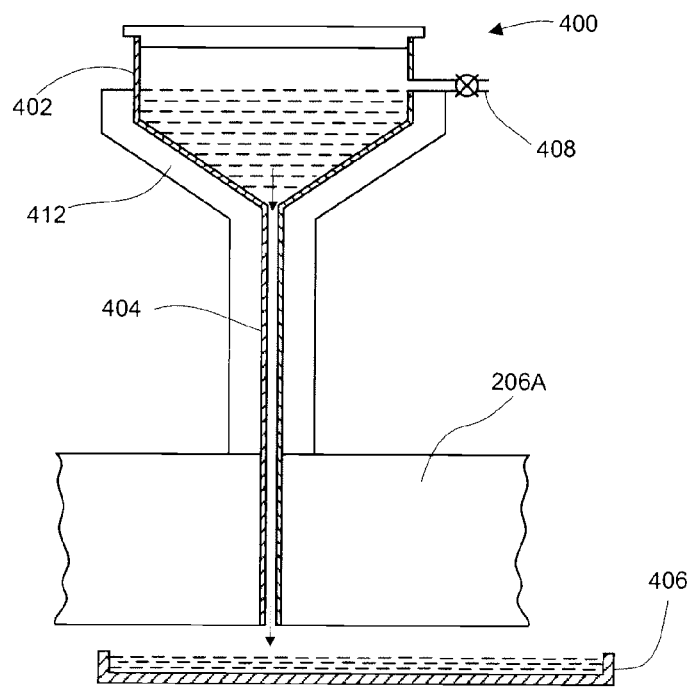
FIG. 5 is a schematic detailed illustration of an alternative embodiment of the Group VIA material delivery system shown in FIG. 3, wherein the Group VIA material delivery system includes a feeder with a heating apparatus, a supply tube and a container.

FIG. 5 shows an alternative embodiment of the absorber constituent delivery system 400 of the present invention to deliver liquid Group VIA material. In this embodiment, the system 400 comprises a feeder 402, a supply tube 404 and a container 406, which may be designed similar to their counterparts in the previous embodiment shown in FIGS. 3 and 4. However, in this embodiment, a heating apparatus 412 replaces the cooling system of the previous embodiment to keep the system substantially at or above melting temperature of the desired Group VIA material, i.e. at or above 220° C. for Se, at or above 449° C. for Te, at or above 115° C. for S, and temperatures between 115° C. and 449° C. for mixtures. The heating apparatus may additionally enclose all parts of the feeder (not shown). The inert gas flow from a gas inlet 408 controls and regulates the flow of the molten Group VIA material into the container 406. When the gas flow is turned on it pushes the liquid through the supply tube and into the container 406, and when the gas flow is cut off, liquid flow stops.

Figures 6A, 6B, 6C:
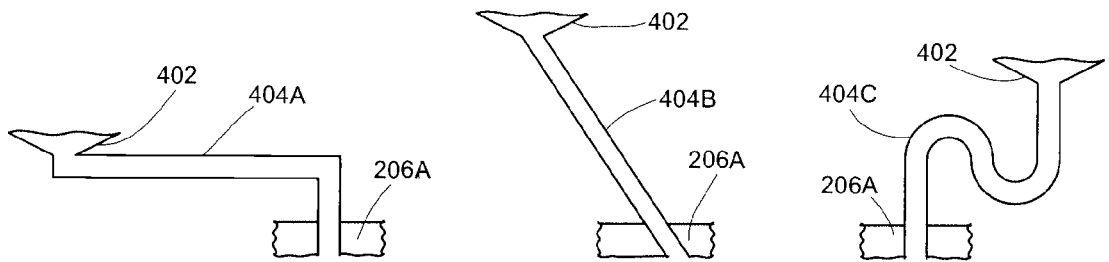
FIGS. 6A-6C are schematic illustrations of alternative supply tube embodiments for the Group VIA material delivery systems.

It should be appreciated that many different designs of supply tubes may be used to practice the invention. Also ingredients other than Group VIA materials may be added into the delivery system in small quantities of typically less than 5 atomic percent, preferably less than 2 atomic percent. For example, Group IA alkali metals such as K, Na and Li may be added to the Group VIA powder or melt as dopants. Such dopants, when delivered to the container 406 along with the molten Group VIA material, evaporate out of the container 406 and dope the growing Group IBIIIAVIA compound layer. FIGS. 6A-6C show three exemplary supply tube embodiments to be used in system 400. A horizontal supply tube 404A, an angled supply tube 404B, and an S-shape supply tube may be used to deliver molten Group VIA material from the feeder 402. Particularly, with the S-shape supply tube, the inert gas flow may regulate liquid Group VIA flow more effectively. Of course, supply tubes having any other shape and design are also within the scope of this invention. In a preferred embodiment the method of the present invention is carried out substantially at or above atmospheric pressure. In other words the gas pressure within the reaction channel is preferably in the range of about 600-1500 Torr, most preferably in the range of about 700-1000 Torr.

Figure 7:
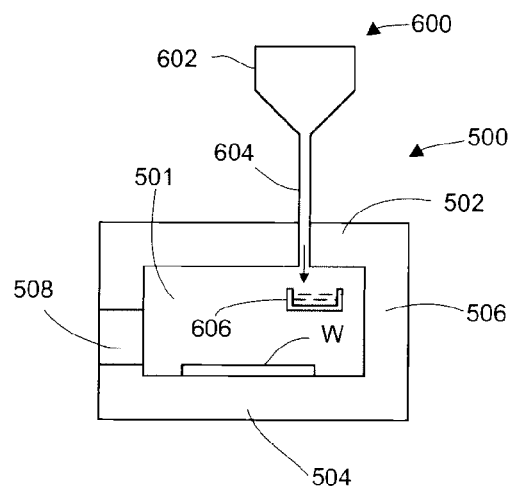
FIG. 7 is a schematic illustration of an embodiment of a heating chamber and a Group VIA material delivery system which is integrated to the heating chamber.

Although in the above embodiments a roll to roll system is used to describe the present invention, as shown in FIG. 7, a heating chamber 500 or a batch type reaction chamber without the entrance and exit openings may also be used to perform the present invention. In this approach, at least one workpiece W can be loaded into a reaction space 501 of the heating chamber 500 which is defined by a top wall 502, a bottom wall 504 and side walls 506 of the heating chamber. A sealable loading/unloading door 508 is used to place the workpiece into the reaction space before the reacting and then remove it after the reacting. Before the process the reaction space 501 may be emptied of air and oxygen and may be filled back with an inert gas. During the process, the reaction space 501 is substantially sealed from the environment and the workpieces may be processed one at a time or in batches. The heating chamber 500 is integrated with a delivery system 600 which may be similar to the delivery systems shown in FIG. 4, 5 or 6, and liquid or molten absorber ingredient such as a Group VIA material may be delivered from a feeder 602 through a supply tube 604 to a container 606 provided inside the reaction space 501. The liquid absorber ingredient may then vaporize slowly by the action of the heat inside the reaction space 501 and provide the absorber ingredient vapor to the workpiece W. Each workpiece may comprise a base and a precursor layer formed on the base. The precursor layer may be converted into a solar cell absorber compound such as a Group IBIIIAVIA compound under heat and the absorber ingredient vapor, such as a Group VIA material vapor provided by the melt in the container as explained before. After reaction, the reacted workpiece may be removed and replaced by an unreacted workpiece.

Although the present invention is described with respect to certain preferred embodiments, modifications thereto will be apparent to those skilled in the art.

We claim:

1. A thermal processing tool for forming a solar cell absorber by reacting a precursor layer disposed over a surface of a continuous flexible workpiece, the reacting taking place within the precursor layer and with a vapor of an Se absorber constituent, the tool comprising:
   a heating chamber to react a portion of the precursor layer disposed within a reaction channel of the heating chamber with the vapor of the absorber constituent, the reaction channel extending between an entrance opening and an exit opening of the heating chamber;
   an exhaust port through which unused vapor of the Se absorber constituent is carried out of the reaction channel, the exhaust port located in a central region of the reaction channel;
   an Se absorber constituent container disposed in the reaction channel, the absorber constituent container being configured to hold the Se absorber constituent in molten form so that the heat from the reaction channel causes the Se absorber constituent to vaporize and form the vapor, wherein the Se absorber constituent container is placed above the continuous flexible workpiece in the reaction channel and in proximity of the top wall of the heating chamber;
   an Se absorber constituent feeder disposed outside the heating chamber, above the Se absorber constituent container, and configured to hold the Se absorber constituent in solid form and to supply the Se absorber constituent to the Se absorber constituent container through a supply tube, wherein the supply tube is configured to deliver the Se absorber constituent in solid form within at least a first portion of the supply tube attached to the Se absorber constituent feeder, wherein the Se absorber constituent feeder includes a cooling system to maintain the Se absorber constituent that is held within the Se absorber constituent feeder in solid form, below a melting point of the Se absorber constituent; and
   a moving mechanism to hold and move the continuous flexible workpiece through the reaction channel of the heating chamber so that the vapor of the absorber constituent from the absorber constituent container is delivered to the portion of the precursor layer disposed within the heating chamber and thereby react the portion of the precursor layer with the vapor of the absorber constituent within the reaction channel to form the solar cell absorber, wherein the moving mechanism includes an un-winder to feed previously unrolled portions of the continuous flexible workpiece into the heating chamber through the first opening and a re-winder to take up and wrap processed portions of the continuous flexible workpiece.

2. The tool of claim 1, wherein the reaction channel is defined by a top wall, a bottom wall, and side walls.

3. The tool of claim 1 further comprising a gas delivery system that delivers gas through the entrance opening and the exit opening towards the central region of the reaction channel, thereby assisting in causing the unused vapor to be carried out of the reaction channel.

4. The tool of claim 1 wherein the supply tube further includes a second portion, wherein the second portion is placed through the top wall so as to expose it to heat from the heating chamber.

5. The tool of claim 4 further comprising a gas delivery system that delivers gas through the entrance opening and the exit opening towards the central region of the reaction channel, thereby assisting in causing the unused vapor to be carried out of the reaction channel.

6. The tool of claim 1 wherein the Se absorber constituent feeder includes a gas inlet to receive an inert gas into the Se absorber constituent feeder.

7. The tool of claim 6 wherein the Se absorber constituent feeder includes a sealable supply door to add the Se absorber constituent to the Se absorber constituent feeder.

8. The tool of claim 1 wherein a length of the heating chamber is in the range of 1 to 15 meters.

* * * * *